(12) United States Patent
Ha

(10) Patent No.: US 12,051,598 B2
(45) Date of Patent: Jul. 30, 2024

(54) WAFER CLEANING DEVICE

(71) Applicant: SK SILTRON CO., LTD., Gumi-si (KR)

(72) Inventor: Se Geun Ha, Gumi-si (KR)

(73) Assignee: SK SILTRON CO., LTD., Gumi-si (KR)

( * ) Notice: Subject to any disclaimer, the term of this patent is extended or adjusted under 35 U.S.C. 154(b) by 871 days.

(21) Appl. No.: 16/981,228

(22) PCT Filed: Mar. 11, 2019

(86) PCT No.: PCT/KR2019/002813
§ 371 (c)(1),
(2) Date: Sep. 15, 2020

(87) PCT Pub. No.: WO2019/245129
PCT Pub. Date: Dec. 26, 2019

(65) Prior Publication Data
US 2021/0035822 A1 Feb. 4, 2021

(30) Foreign Application Priority Data

Jun. 18, 2018 (KR) .................. 10-2018-0069784

(51) Int. Cl.
*H01L 21/67* (2006.01)
*B08B 3/04* (2006.01)
(Continued)

(52) U.S. Cl.
CPC ........ *H01L 21/67057* (2013.01); *B08B 3/048* (2013.01); *B08B 3/08* (2013.01); *H01L 21/67326* (2013.01); *H01L 21/68742* (2013.01)

(58) Field of Classification Search
CPC ......... H01L 21/67057; H01L 21/67086; H01L 21/673; B08B 3/048
See application file for complete search history.

(56) References Cited

U.S. PATENT DOCUMENTS 5,299,584 A * 4/1994 Miyazaki ................ B08B 15/02
134/99.1
5,503,171 A 4/1996 Yokomizo et al.
(Continued)

FOREIGN PATENT DOCUMENTS

JP 62-213257 A 9/1987
JP 6-333907 A 12/1994
(Continued)

OTHER PUBLICATIONS

KR20030008448—Machine Translation (Year: 2003).*
(Continued)

*Primary Examiner* — Marc Lorenzi
(74) *Attorney, Agent, or Firm* — Lewis Roca Rothgerber Christie LLP

(57) ABSTRACT

The present invention relates to a wafer cleaning device which can prevent a cleaning solution from leaking and enables prompt treatment. The present invention provides a wafer cleaning device comprising: a cleaning bath which receives a cleaning solution and from which the cleaning solution overflows according to the dipping of wafers; a plurality of lift parts arranged at the outside of the cleaning bath and dipping the cassette into the cleaning solution in the cleaning bath; an external water tank having the cleaning bath and the lift parts received therein and including a drain hole through which the cleaning solution is drained; and a tray which can be detachably attached to the inner bottom surface of the external water tank and collects the cleaning solution to guide same to the drain hole.

13 Claims, 4 Drawing Sheets

(51) Int. Cl.
*B08B 3/08* (2006.01)
*H01L 21/673* (2006.01)
*H01L 21/687* (2006.01)

(56) References Cited

U.S. PATENT DOCUMENTS

2011/0309051 A1 12/2011 Choi et al.
2013/0316485 A1* 11/2013 Furutani ........... H01L 21/67057
438/57

FOREIGN PATENT DOCUMENTS

| | | |
|---|---|---|
| JP | 11-168077 A | 6/1999 |
| JP | H 11-168077 A | 6/1999 |
| JP | 2001-015469 A | 1/2001 |
| JP | 2004-221343 A | 8/2004 |
| JP | 2009-218514 A | 9/2009 |
| JP | 2012-507881 A | 3/2012 |
| JP | 2014-170782 A | 9/2014 |
| KR | 1999-0039059 U | 11/1999 |
| KR | 2003-0008448 A | 1/2003 |
| KR | 10-2004-0036300 A | 4/2004 |
| KR | 10-2018-0060059 A | 6/2018 |

OTHER PUBLICATIONS

International Search Report corresponding to PCT/KR2019/002813, dated Jul. 3, 2019 with English translation, 5 pages.
Korean Office Action of corresponding KR 10-2018-0069784, dated Nov. 21, 2019, 6 pages.

* cited by examiner

WAFER CLEANING DEVICE

CROSS-REFERENCE TO RELATED APPLICATION(S)

This application is a U.S. National Phase Patent Application and claims priority to and the benefit of International Application Number PCT/KR2019/002813, filed on Mar. 11, 2019, which claims priority to Korean Patent Application Number 10-2018-0069784, filed on Jun. 18, 2018, the entire contents of all which are incorporated herein by reference.

TECHNICAL FIELD

The present invention relates to a wafer cleaning device capable of preventing a cleaning solution from leaking to the outside and quickly responding thereto.

BACKGROUND ART

In general, a silicon wafer is fabricated through a growing process for growing polycrystalline silicon into a single crystal silicon ingot, a slicing process for slicing the grown single crystal silicon ingot into a wafer shape, a lapping process for uniformizing and planarizing a thickness of a wafer, an etching process for removing or mitigating a damage generated by mechanical polishing, a polishing process which mirror-policing a surface of the wafer, and a cleaning process for cleaning a wafer.

Normally, a wafer cleaning device is used to perform the cleaning process, and while a cleaning solution of a strong alkaline solution is contained in an inner bath and overflowing the cleaning solution from the inner bath, a wafer moving robot immerses wafers in the cleaning solution of the inner bath, and then a lift part shakes the wafers vertically in the cleaning solution to clean the surface of the wafers.

In addition, in the wafer cleaning device, the inner bath, an outer bath, and the lift part are provided inside an external water bath, but when the inner/outer bath is cleaned by pure water, the cleaning solution overflows due to an abnormal operation, or the cleaning solution drops when moving wafers, the cleaning solution is drained through a drain hole provided in the external water bath.

However, when a strong alkaline solution such as KOH is used as the cleaning solution in the wafer cleaning device, when a component of a metal material is exposed to a cleaning solution having high penetrability for a long time, the cleaning solution leaks due to decrepitude or degradation.

Korean Laid-Open Patent Publication No. 2004-0036300 relates to a chemical circulation system having a leak sensing function of a wafer wet etching device, and a screw installed in a tube connected to a bath, a generator connected to the screw, and a leak sensing device including a sensor electrically connected to the generator are provided.

Therefore, when a leak occurs in the tube, the air introduced through the leak rises to rotate the screw, and a current generated in the generator according to screw rotation is transmitted to the sensor to sense the leak.

However, according to the related art, the leakage of the cleaning solution may be sensed only in a tube connected to a cleaning bath, and the cleaning solution often leaks from the external water bath due to decrepitude or degradation, but there is a problem that since the cleaning solution leaks to the outside through the external water bath, it is difficult to ensure safety.

In addition, when the cleaning solution leaks from the external water bath side, the cleaning process is stopped, and then a leaking portion is visually sensed and the leaking portion is welded, but there is a problem that since not only a process is stopped but also a long time is taken to sense and correct the leaking portion, production efficiency is lowered.

DISCLOSURE

Technical Problem

The present invention is directed to solving the above described problems in the related art and providing a wafer cleaning device capable of preventing a cleaning solution from leaking to the outside and quickly responding thereto.

Technical Solution

The present invention provides a wafer cleaning device includes: a cleaning bath containing a cleaning solution, wherein the cleaning solution overflows as wafers are dipped; a plurality of lift parts provided outside the cleaning bath and dipping a cassette into the cleaning solution inside the cleaning bath; an external water bath accommodating the cleaning bath and the lift part and having a drain hole through which the cleaning solution is drained; and a tray detachable from an inner bottom surface of the external water bath and collecting the cleaning solution to guide it to the drain hole. Therefore, it is possible to prevent the cleaning solution from leaking to the outside, and to quickly respond to the leakage of the cleaning solution to the outside.

The tray may be provided with supporters for supporting the cleaning bath and mounting holes through which the lift parts pass, and may be provided such that a drain port placed inside the drain hole of the external water bath protrudes downward. Therefore, the cleaning bath may be stably mounted at a predetermined location inside the external water bath by the tray.

The tray may be provided with an outer sidewall protruding upward from a circumferential portion meeting an inner surface of the external water bath and a plurality of inner sidewalls protruding upward from each of the mounting holes. Therefore, it is possible to prevent the cleaning solution collected in the tray from flowing into the external water bath.

The tray may be configured to be inclined downward toward the drain port. Therefore, the cleaning solution collected in the tray may be drained smoothly.

The wafer cleaning device of the present invention may further include a first guide portion provided between the inner surface of the external water bath and the tray, and guiding the cleaning solution dropped on the inner surface of the external water bath to the tray. Therefore, even though the cleaning solution drops on the inner surface of the external water bath, the cleaning solution is guided by the first guide portion while flowing down, and thus it may be collected in the tray.

The first guide portion may be bolted to an inner surface of a lower portion of the external water bath. Therefore, the first guide portion may be easily attached to and detached from the external water bath.

The first guide portion may be configured in a bar shape having an inclined surface for guiding the cleaning solution to flow down, and may be made of a non-metallic material. Therefore, it is possible to prevent the first guide portion from being corroded by the cleaning solution.

The wafer cleaning device of the present invention may further include a second guide portion provided between a circumferential surface of the lift part and the tray, and guiding the cleaning solution dropped on the circumferential surface of the lift part to the tray. Therefore, even though the cleaning solution drops on the lift part, the cleaning solution is guided by the second guide portion while flowing down, and thus it may be collected in the tray.

The second guide portion may be bolted to a circumferential surface of a lower portion of the lift part. Therefore, the second guide portion may be easily attached to and detached from the lift part.

The second guide portion may be configured in a cylindrical shape having an inclined surface that surrounds the lower portion of the lift part and guides the cleaning solution to flow down, and may be made of a non-metallic material. Therefore, it is possible to prevent the second guide portion from being corroded by the cleaning solution.

Advantageous Effects

In a wafer cleaning device according to the present invention, a cleaning bath and a lift part are installed inside an external water bath, and a tray capable of collecting and draining a cleaning solution is provided on an inner bottom surface of the external water bath, and thus it is possible to ensure safety by preventing the cleaning solution from leaking to the outside in advance, and even though the leakage of the cleaning solution to the outside occurs, only the tray may be quickly mounted to respond thereto, and thus there is an advantage that production efficiency may be improved.

MODES OF THE INVENTION

Hereinafter, embodiments will be described in detail with reference to the accompanying drawings. However, the scope of the spirit of the present invention may be determined from the matters disclosed in the embodiments, and the spirit of the present invention of the embodiments include practical modifications such as addition, deletion, modification, and the like of components to the following proposed embodiments.

Figure 1:
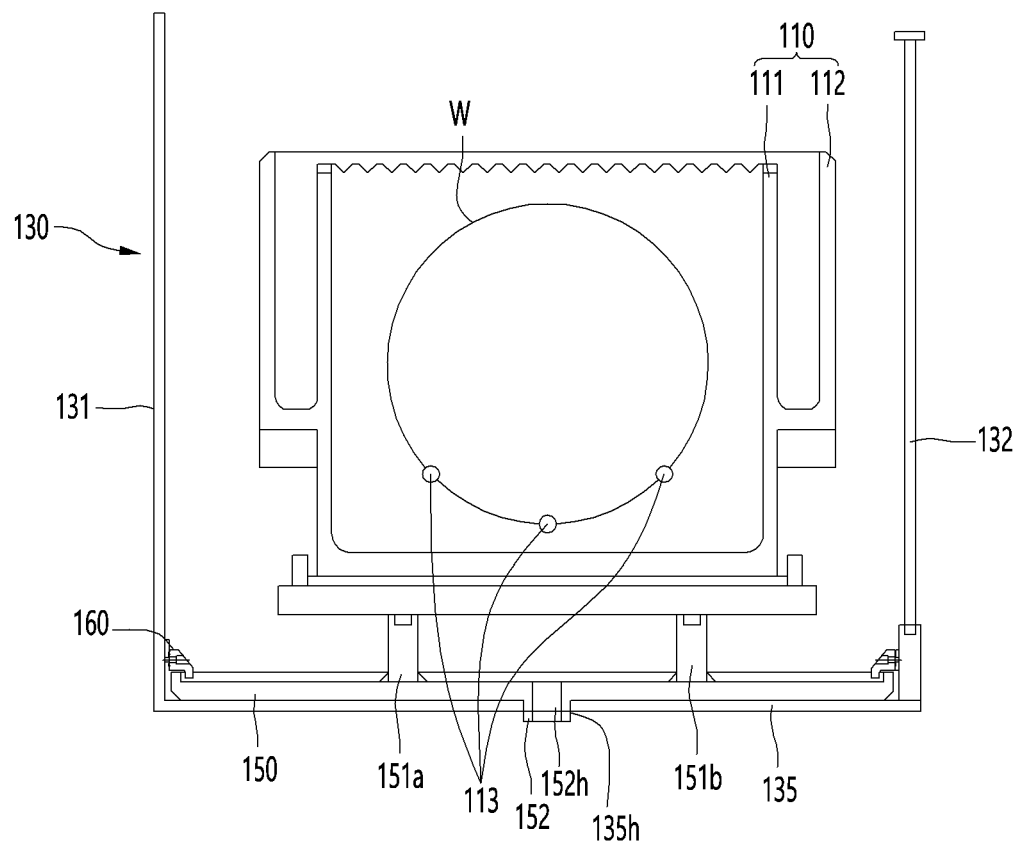
FIG. 1 is a front view showing a wafer cleaning device according to the present invention.
Figure 2:
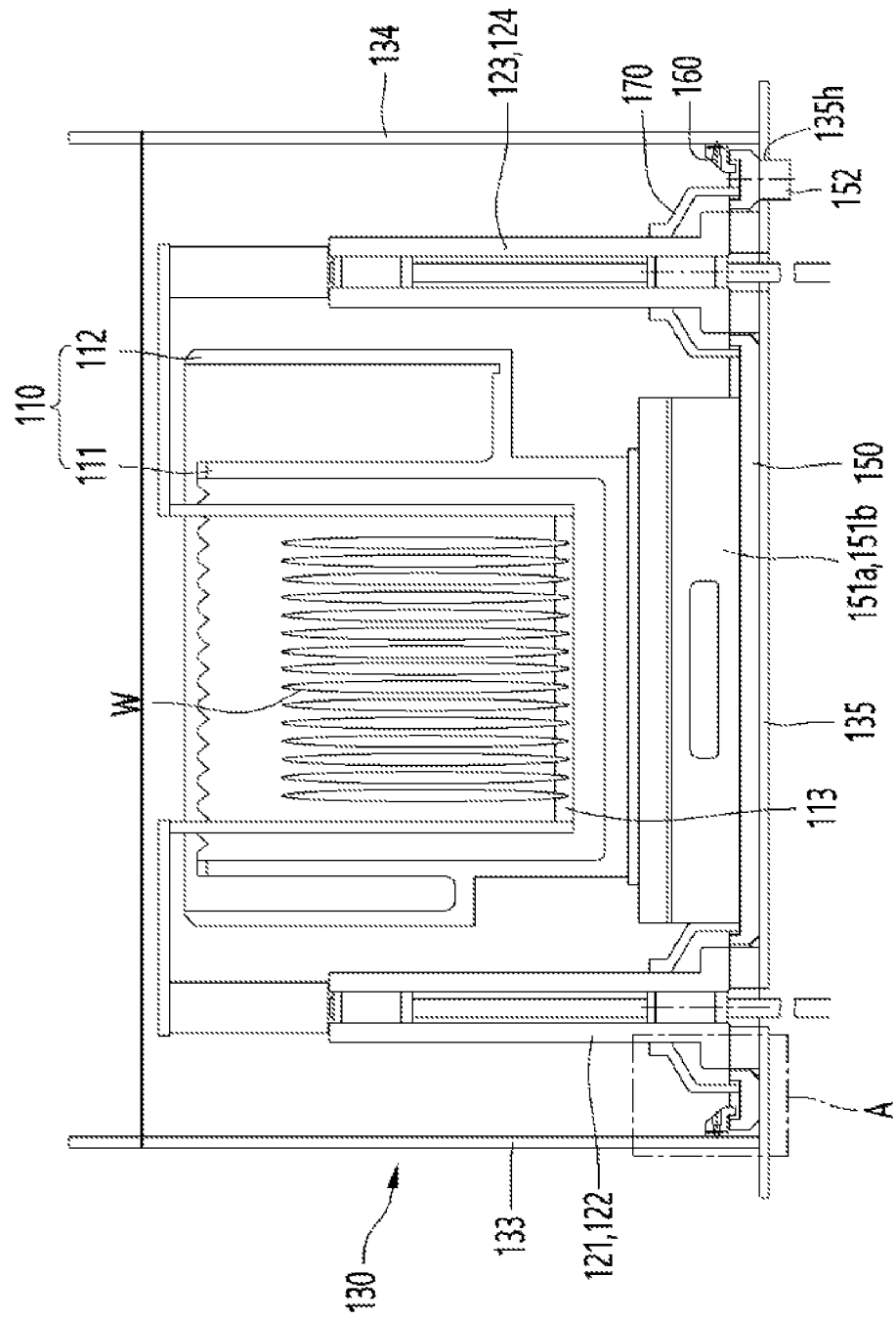
FIG. 2 is a side view of a wafer cleaning device according to the present invention.

FIG. 1 and FIG. 2 are a front view and a side view showing a wafer cleaning device according to the present invention.

In the wafer cleaning device according to the present invention, as shown in FIGS. 1 and 2, a cleaning bath 110 and four lift parts 121, 122, 123, and 124 are provided inside an external water bath 130, a tray 150 for collecting and draining a cleaning solution is provided inside the external water bath 130, and first and second guide portions 160 and 170 for guiding the cleaning solution to the tray 150 are provided.

The cleaning bath 110 may be composed of an inner bath 111 containing the cleaning solution and an outer bath 112 containing the cleaning solution overflowing from the inner bath 111, and may be configured such that a clean cleaning solution is supplied to the inner bath 111 or the cleaning solution overflowed in the outer bath 112 circulates to the inner bath again.

In addition, a bar-shaped placing portion 113 in which grooves on which wafers W are placed are provided in a row, is provided inside the inner bath 111, and three placing portions 113 are provided so as to support three places at a lower portion of the wafers W.

Of course, the wafers W are stored in a state that they are housed in a cassette at a predetermined distance in a front-rear direction, and may be transferred at once while a wafer moving robot (not shown) holds edges of the wafers W.

Therefore, the wafer moving robot holds the wafers W stored in the cassette at once, transfers them to an inside of the inner bath 111 to fix them to the placing portions 113, and then the wafers W are cleaned while overflowing the cleaning solution contained in the inner bath 111.

The lift parts 121, 122, 123, and 124 are provided so as to move up/down frames connected to a front/rear of the placing portions 113, and four lift parts are provided on both sides of the front/rear of the cleaning bath.

Therefore, when the lift parts 121, 122, 123, and 124 shake the placing portions 113 in a vertical direction, cleaning effect of the wafers W by the cleaning solution may be enhanced.

The external water bath 130 is a kind of frame made of metal, and is configured with both side surfaces 131 and 132, front and rear surfaces 133 and 134, and a bottom surface 135, and the cleaning bath 110 and the lift parts 121, 122, 123, and 124 are installed on an inner bottom surface of the external water bath 130.

At this time, the bottom surface 135 of the outer bath is provided with a drain hole 135h through which the cleaning solution, pure water, etc. may be drained, and it is provided at a rear center with respect to the cleaning bath 110.

Therefore, even though the pure water is supplied to overflow in order to clean the cleaning bath 110 itself, the cleaning bath 110 operates abnormally so that the cleaning solution overflows to the outside of the outer bath 112, or the cleaning solution drops while the wafers W are moving from the cleaning bath 110, the cleaning solution may be drained through the drain hole 135h of the external water bath.

The tray 150 is installed over the entire inner bottom surface 135 of the external water bath, and is preferably made of a non-metallic material such as PVC that is not degraded even with a strong alkaline solution.

In addition, the tray 150 may be separately mounted on the external water bath 130 by fastening members such as a bolt, etc. so as to be easily attached and detached, and is formed in a kind of plate shape capable of collecting the cleaning solution.

At this time, the tray 150 may be provided with supporters 151a and 151b for supporting the cleaning bath 110, and holes 154h (shown in FIG. 3) in which the lift parts 121, 122, 123, and 124 may be installed, and a drain hole 152h for draining the cleaning solution is provided.

Of course, the drain hole 152h of the tray is provided at the same location as the drain hole 135h of the external water bath.

The first guide portion 160 is provided between the external water bath 130 and the tray 150, and prevents the cleaning solution from dropping on a gap between the tray 150 and the both side surfaces 131 and 132 and the front and rear surfaces 133 and 134 of the external water bath, and guides the cleaning solution that has dropped on an inner wall surface of the external water bath 130 to the tray 150.

In addition, the first guide portion 160, like the tray 150, is made of a non-metallic material such as PVC that is not degraded by the cleaning solution, and is configured so as to be easily attached and detached by being bolted to the both side surfaces 131 and 132 and the front and rear surfaces 133 and 134 of the external water bath.

The second guide portion 170 is provided between the lift parts 121, 122, 123, and 124 and the tray 150, and prevents the cleaning solution from dropping on a gap between the lift parts 121, 122, 123, and 124 and the tray 150, and guides the cleaning solution that has dropped on a lower circumferential surface of the lift parts 121, 122, 123, and 124 to the tray 150.

In addition, the second guide portion 170, like the tray 150, may be made of a non-metallic material, such as PVC that is not degraded by the cleaning solution, and is configured so as to be easily detachable by being bolted to circumferential surfaces of the lift parts 121, 122, 123, and 124.

Figure 3:
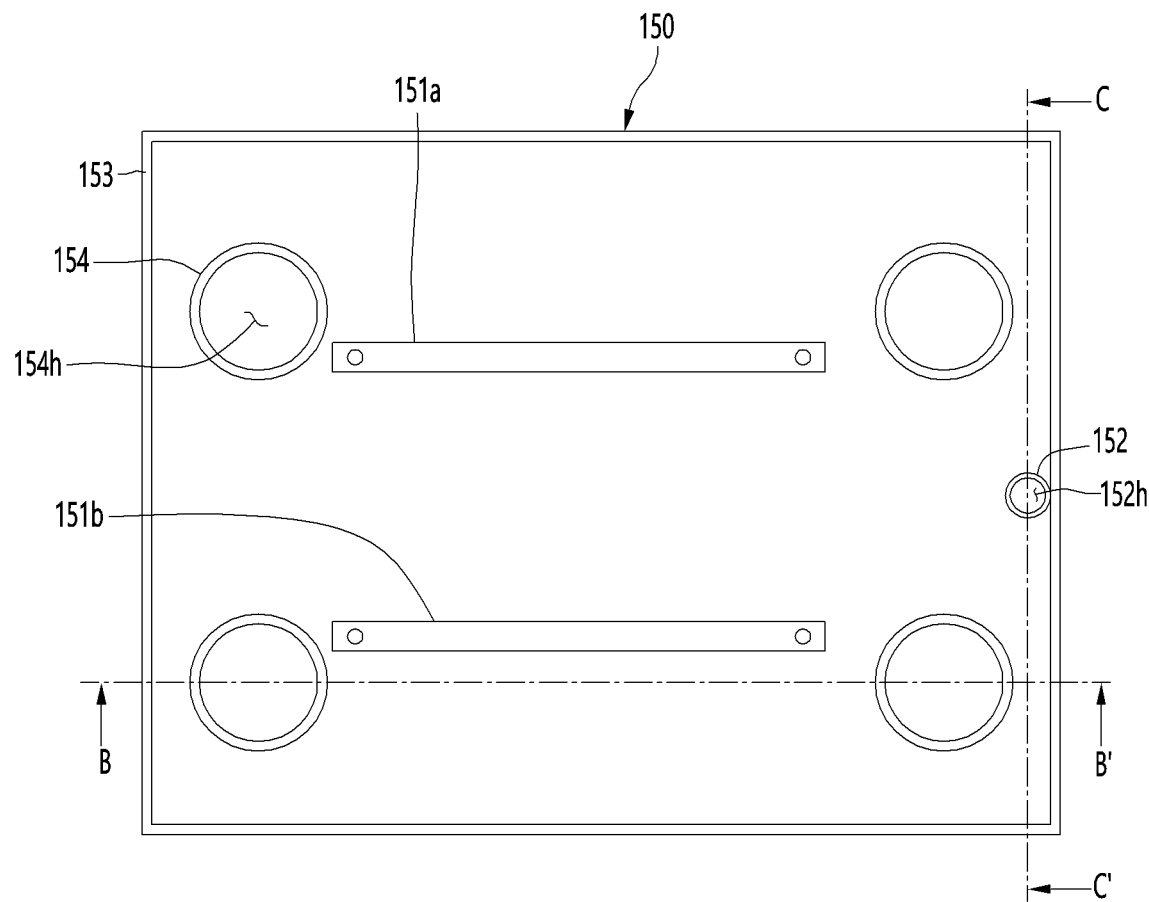
FIG. 3 is a plan view showing a tray of a wafer cleaning device according to the present invention.
Figure 4:
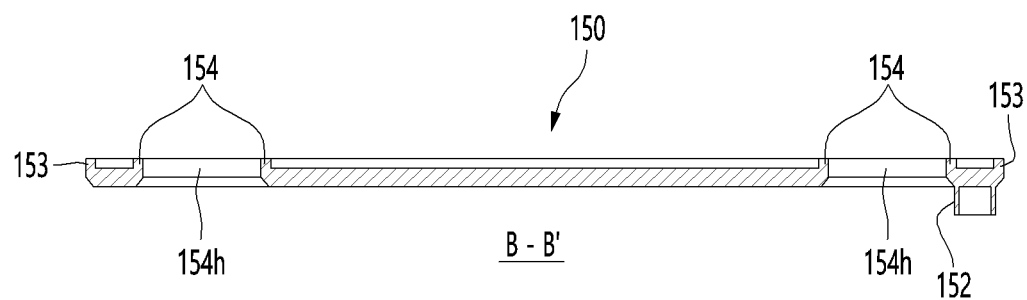
FIGS. 4 and 5 are cross-sectional views taken along lines B-B' and line C-C' of FIG. 4.
Figure 5:
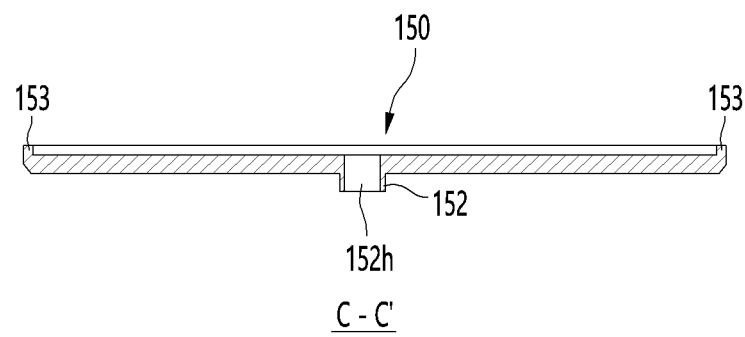
Figure 6:
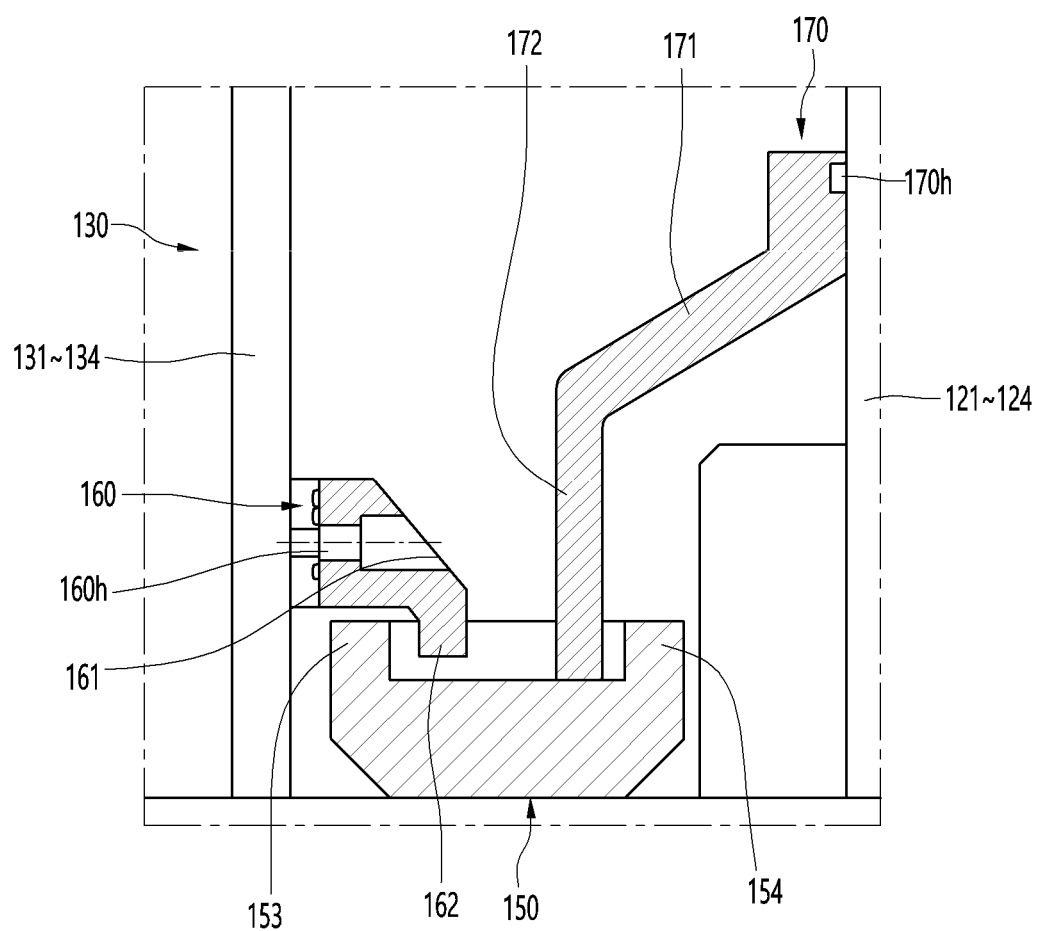
FIG. 6 is a view showing a mounting structure of first and second guide portions applied to FIG. 3.

FIG. 3 is a plan view showing a tray of a wafer cleaning device according to the present invention, FIGS. 4 and 5 are cross-sectional views taken along lines B-B' and C-C' of FIG. 4, and FIG. 6 is a view showing a mounting structure of first and second guide portions applied to FIG. 3.

When examining a configuration of the tray 150 with reference to FIGS. 3 to 5, it is configured in a plate shape like a shape of the bottom surface 135 of the external water bath (shown in FIG. 2).

In this case, a pair of supporters 151a and 151b on which the cleaning bath 110 (shown in FIG. 2) may be mounted at a center of the tray 150 may be provided, and the drain hole 152h through which the cleaning solution is drained and a drain port 152 having a downwardly protruding shape from the drain hole 152h are provided behind the tray 150.

Therefore, the drain port 152 of the tray may fix the tray 150 inside the external water bath 130 (shown in FIG. 1), and it is possible to prevent the drain hole 135h (shown in FIG. 2) of the external water bath from being degraded by preventing the drain hole 135h (shown in FIG. 2) of the external water bath from directly contacting the cleaning solution by the drain port 152 of the tray.

Of course, the tray 150 is configured in a horizontal plane shape, but may be configured in an inclined form so as to guide the cleaning solution to the drain port 152.

In addition, an outer sidewall 153 is provided so as to protrude upward around the tray 150, and the outer sidewall 153 is installed so as to meet the both side surfaces 131 and 132 (shown in FIG. 1) and the front and rear surfaces 133 and 134 (shown in FIG. 2) of the external water bath.

Therefore, the outer sidewall 153 provided in the tray 150 prevents the cleaning solution from flowing to the outside of the tray 150, and the gap between the external water bath 130 (shown in FIG. 2) and the tray 150 may be further reduced.

In addition, the tray 150 is provided with four mounting holes 154h for installing the lift parts 121, 122, 123, and 124 (shown in FIG. 2), and an inner sidewall 154 is provided so as to protrude upward around each mounting hole 154h.

Therefore, the inner sidewalls 154 of the tray 150 are installed so as to meet the circumferential surfaces of the lift parts 121, 122, 123, and 124 (shown in FIG. 2), so that the cleaning solution does not flow down to the mounting holes 154h, and the gap between the lift parts 121, 122, 123, and 124 (shown in FIG. 2) and the tray 150 may be further reduced.

A configuration and mounting structure of the first and second guide portions 160 and 170 will be examined as follows with reference to FIG. 6.

The first guide portions 160 and 170 may be configured in a bar shape of a non-metallic material, and a vertical outer portion of the first guide portion 160 may be positioned so as to meet the inner side surfaces 131 to 134 of the external water bath, and a bolt hole 160h that may be bolted to the external water bath 130 is provided so as to cross in a horizontal direction.

In addition, the first guide portion 160 is provided with an inclined surface 161 inclined downward in an inner upper corner portion thereof, and it may be configured so as to guide the cleaning solution from the external water bath 130 of one side thereof to the tray 150 of a lower side thereof, but the present invention is not limited thereto.

In addition, the first guide portion 160 is positioned on the tray 150 with a lower end portion 162 protruding downward from an inner lower portion thereof, and may be installed to be spaced apart from an inner bottom surface of the tray 150 by a predetermined distance so as not to prevent the cleaning solution inside the tray 150 from flowing in a draining direction, but the present invention is not limited thereto.

Of course, the lower end portion 162 of the first guide portion may be positioned inside the outer sidewall 153 of the tray 150 so as to doubly block that the cleaning solution flows down to the outside of the tray 150.

The second guide portion 170 may be configured in a cylindrical shape of a non-metallic material, an upper inner circumferential surface thereof may be installed so as to meet the circumferences of the lift parts 121 to 124, and a bolt hole 170h which may be bolted is provided in a horizontal direction.

In addition, the second guide portion 170 is provided with an inclined surface 171 of which a diameter increases from an upper portion to a lower portion, and it may be configured to guide the cleaning solution from the lift parts 121 to 124 positioned in a center thereof to the tray 150 positioned around thereof, but the present invention is not limited thereto.

In addition, a lower end portion 172 which is vertically continuous at a lower side of the inclined surface 171 of the second guide portion is positioned on the tray 150, and it may be installed so as to meet the inner bottom surface of the tray 150 in order to suppress the cleaning solution from flowing to the lift parts 121 to 124, but the present invention is not limited thereto.

Of course, the lower end portion 172 of the second guide portion may be positioned outside the inner sidewall 154 of the tray to doubly block that the cleaning solution flows down into the mounting hole 154h (shown in FIG. 3).

When the tray 150 of a non-metallic material and the first and second guide portions 160 and 170 configured as described above are installed on the inner bottom surface of the external water bath 130 of a metallic material, even though the cleaning solution drops on an inner side of the external water bath 130, the cleaning solution does not directly meet the external water bath 130 by the tray 150, and it is possible to prevent the cleaning solution from leaking to the outside due to decrepitude or degradation of the external water bath 130 to ensure safety by preventing the cleaning solution from flowing into a gap between the external water bath 130 and the tray 150 or a gap between the lift parts 121 to 124 and the tray 150 by the first and second guide portions 160 and 170.

In addition, when leakage of the cleaning solution occurs in the external water bath 130, even though a leak portion is not found, the tray 150 and the first and second guide portions 160 and 170 are easily mounted, thereby quickly stopping the leakage of the cleaning solution in the external water bath 130 and performing immediately a process, and thus production efficiency may be improved.

INDUSTRIAL APPLICABILITY

The present invention is applicable to a wafer cleaning device for cleaning a wafer during a process of slicing a single crystal ingot to make a wafer.

The invention claimed is:

1. A wafer cleaning device comprising:
a cleaning bath containing a cleaning solution, wherein the cleaning solution overflows when a cassette, containing wafers, is dipped in the cleaning bath;
a lift provided outside the cleaning bath configured to dip the cassette into the cleaning solution inside the cleaning bath;
an external water bath accommodating the cleaning bath and the lift, and having a drain hole through which the cleaning solution is drained; and
a tray detachable from an inner bottom surface of the external water bath and collecting the cleaning solution to guide the cleaning solution to the drain hole,
wherein the tray is provided with supporters for supporting the cleaning bath and mounting holes through which the lift passes, and wherein the tray is further provided with a plurality of inner sidewalls protruding upward from each of the mounting holes, and
wherein the plurality of inner sidewalls are formed lower than a height of the supporters.

2. The wafer cleaning device of claim 1, wherein the tray is provided such that a drain port placed inside the drain hole of the external water bath protrudes downward.

3. The wafer cleaning device of claim 2, wherein the tray is provided with an outer sidewall protruding upward from a circumferential portion meeting an inner surface of the external water bath and the outer sidewall is formed lower than the height of the supporters.

4. The wafer cleaning device of claim 2, wherein the tray is configured to be inclined downwardly toward the drain port.

5. The wafer cleaning device of claim 1, further comprising:
a first guide portion provided between an inner surface of the external water bath and the tray, and guiding the cleaning solution dropped on the inner side surface of the external water bath to the tray.

6. The wafer cleaning device of claim 5, wherein the first guide portion is bolted to an inner surface of a lower portion of the external water bath.

7. The wafer cleaning device of claim 5, wherein the first guide portion is configured in a bar shape having an inclined surface for guiding the cleaning solution to flow down.

8. The wafer cleaning device of claim 5, wherein the first guide portion is made of a non-metallic material.

9. The wafer cleaning device of claim 1, further comprising:
a second guide portion provided between a circumferential surface of the lift and the tray, and guiding the cleaning solution dropped on the circumferential surface of the lift to the tray.

10. The wafer cleaning device of claim 9, wherein the second guide portion is bolted to a circumferential surface of a lower portion of the lift.

11. The wafer cleaning device of claim 10, wherein the second guide portion is configured in a cylindrical shape having an inclined surface that surrounds the lower portion of the lift and guides the cleaning solution to flow down.

12. The wafer cleaning device of claim 9, wherein the second guide portion is made of a non-metallic material.

13. The wafer cleaning device of claim 1, wherein the tray is made of a non-metallic material.

* * * * *